(12) United States Patent
Arcus

(10) Patent No.: US 6,426,662 B1
(45) Date of Patent: Jul. 30, 2002

(54) TWISTED-RING OSCILLATOR AND DELAY LINE GENERATING MULTIPLE PHASES USING DIFFERENTIAL DIVIDERS AND COMPARATORS TO MATCH DELAYS

(75) Inventor: Christopher G. Arcus, San Jose, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/683,040

(22) Filed: Nov. 12, 2001

(51) Int. Cl.[7] .............. G06F 1/04; H03K 3/00
(52) U.S. Cl. ................ 327/295; 327/274; 331/57
(58) Field of Search ................... 327/291, 295, 327/149, 158, 274, 280, 287; 331/57

(56) References Cited

U.S. PATENT DOCUMENTS

| | | | |
|---|---|---|---|
| 3,671,872 A | 6/1972 | Pauly | 328/55 |
| 4,805,795 A | 2/1989 | Keegan | 375/106 |
| 5,051,970 A | 9/1991 | Ishii et al. | 369/13 |
| 5,077,529 A | 12/1991 | Ghoshal et al. | 328/155 |
| 5,109,394 A | 4/1992 | Hjerpe et al. | 375/119 |
| 5,120,990 A | 6/1992 | Koker | 307/269 |
| 5,422,835 A | 6/1995 | Houle et al. | 364/703 |
| 5,495,205 A | 2/1996 | Parker et al. | 331/1 |
| 5,532,633 A | 7/1996 | Kawai | 327/174 |
| 5,544,203 A | 8/1996 | Casasanta et al. | 375/376 |
| 5,673,295 A * | 9/1997 | Read et al. | 375/356 |
| 5,970,110 A | 10/1999 | Li | 377/48 |
| 6,037,818 A | 3/2000 | Sato | 327/272 |
| 6,094,076 A | 7/2000 | Saeki | 327/116 |
| 6,100,735 A | 8/2000 | Lu | 327/158 |
| 6,101,197 A | 8/2000 | Keeth et al. | 370/517 |
| 6,163,226 A * | 12/2000 | Jelinek et al. | 331/177 R |

* cited by examiner

Primary Examiner—Terry D. Cunningham
Assistant Examiner—Quan Tra
(74) Attorney, Agent, or Firm—Stuart T. Auvinen

(57) ABSTRACT

A phase-locked loop (PLL) or a delay-locked loop (DLL) has differential delay stages with differential outputs driving differential clock inputs to a pair of differential toggle flip-flops. One flip-flop changes state on the rising edge and the other on the falling edge of the true output from the delay stage. Differential-to-single-ended buffers convert differential flip-flop outputs to single-ended multi-phase clocks. To avoid erratic or multiple oscillation and overtones, fewer than eight and preferably four differential delay stages are used. The delay stages are arranged in a twisted-ring with the differential outputs of the last delay stage crossed over and fed back to the differential inputs of the first delay stage. Tail currents of the delay stages can be adjusted by a voltage generated by a PLL loop. The differential toggle flip-flops allow for many taps or clock phases to be generated from the few delay stages.

20 Claims, 11 Drawing Sheets

US 6,426,662 B1

TWISTED-RING OSCILLATOR AND DELAY LINE GENERATING MULTIPLE PHASES USING DIFFERENTIAL DIVIDERS AND COMPARATORS TO MATCH DELAYS

BACKGROUND OF THE INVENTION

This invention relates to clock generators, and more particularly to precision multi-phase clock generators using differential logic.

Many electronic devices and systems employ clock logic. High-speed clocks can be routed to flip-flops and registers to control sequencing of logical states and signals. Very precise clocks are required for some applications. In particular, multiple phases of a clock can be generated, allowing very precise selection of the clock's phase.

For example, the period of a high-speed clock can be divided into 16 equally-spaced phases. FIG. 1 shows a prior-art clock generator that uses a ring oscillator to generate 16 clock phases. A ring of 16 inverters 12 passes a clock pulse around in a loop.

Each inverter 12 in the loop outputs a clock with a phase shift that depends on the position of the inverter within the loop. For example, the first inverter 12 outputs clock $\phi 1$ with a phase being ahead of clock $\phi 5$ by four inverter delays and ahead of clock $\phi 9$ by eight inverter delays. By controlling and matching the inverter delays, a clock period can be divided into 16 equally-spaced phases $\phi 1$ to $\phi 16$.

While such ring oscillators are useful, various problems can occur. Erratic oscillation or multi-frequency oscillation can occur when 8 or more inverter stages are used in a loop. For example, when each of 8 inverter stages has one pole and a 90-degree phase shift, the total phase shift in the loop is 8×90 or 720 degrees. Then the loop can oscillate at either or both 720 degrees and 360 degrees. Such multiple oscillation can produce frequency overtones in the outputs. This is similar to a vibrating string on a musical instrument, which can vibrate at secondary frequencies or overtones.

Unfortunately, limiting the number of inverter stages in a loop also limits the number of phases that can be easily generated. It is desired to use few inverter stages to avoid overtone oscillation, but still provide enough taps to produce fine-resolution multi-phase clocks.

DETAILED DESCRIPTION

The present invention relates to an improvement in clock generators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
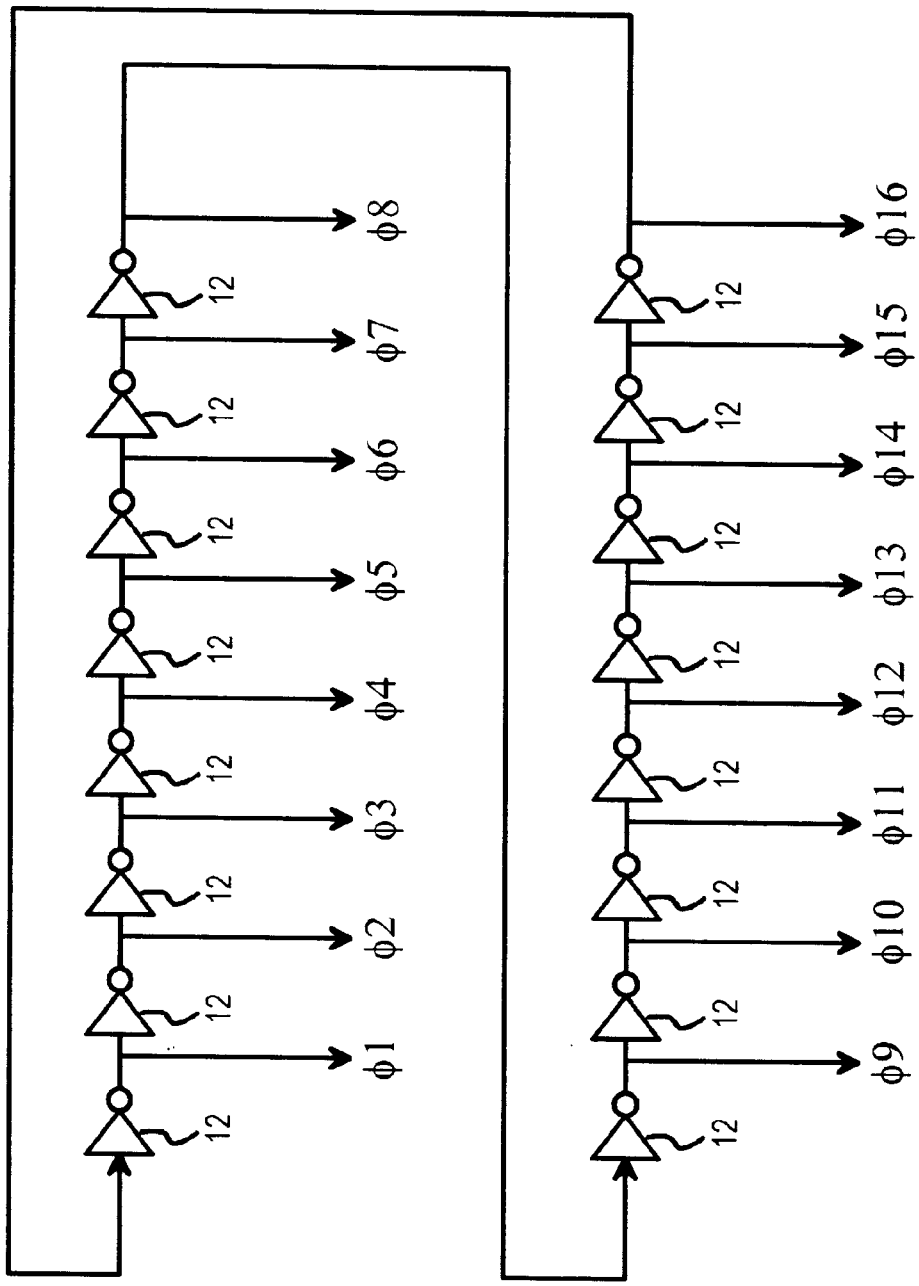
FIG. 1 shows a prior-art clock generator that uses a ring oscillator to generate 16 clock phases.
Figure 2:
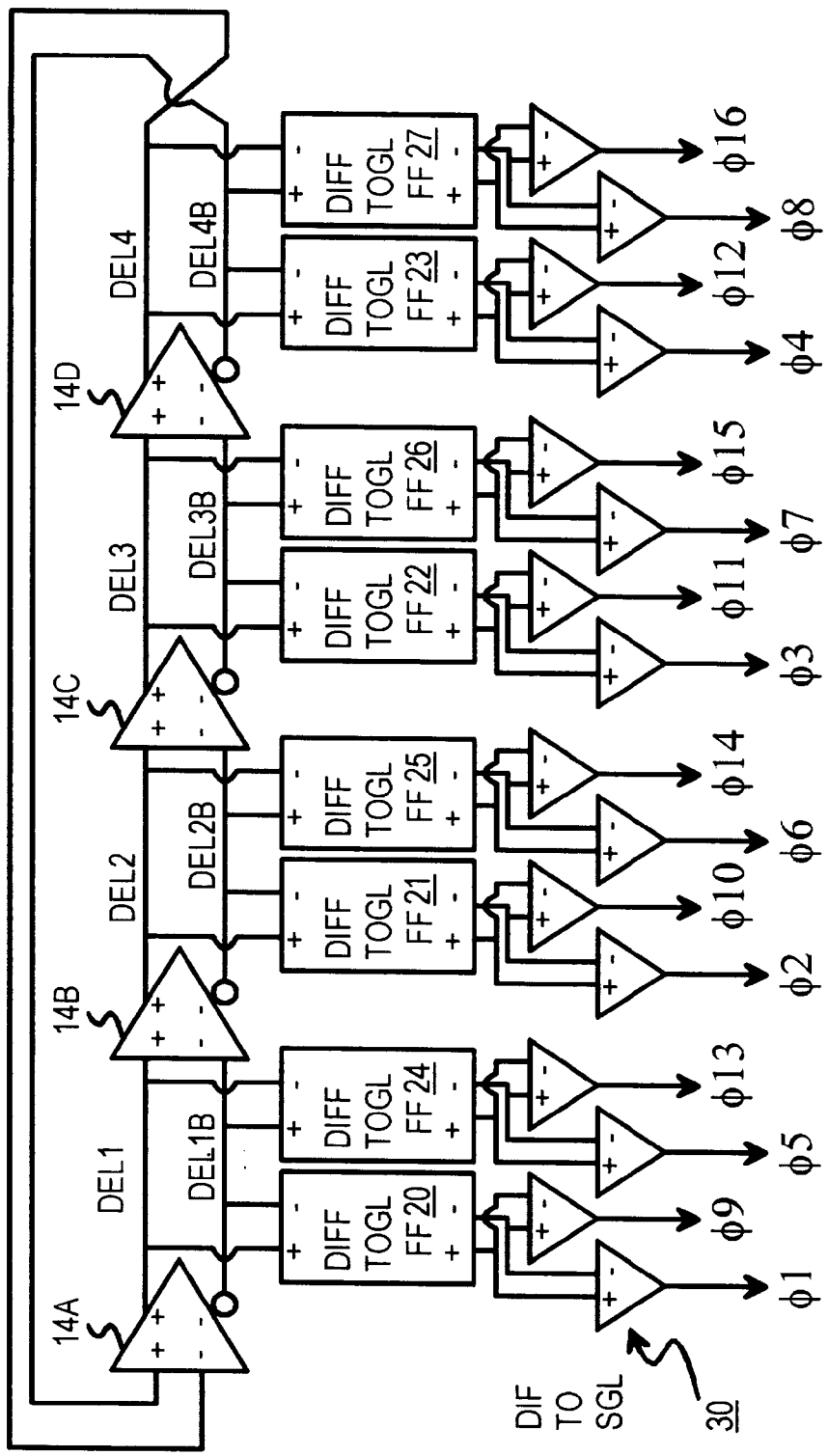
FIG. 2 is a block diagram of twisted-ring clock generator using differential logic.

FIG. 2 is a block diagram of twisted-ring clock generator using differential logic. To avoid multiple-frequency oscillation, the number of stages is reduced to less than 8, such as four. The delay stages 14A–14D are differential buffers that have true (+) and complement (−) inputs, and drive true (+) and complement (−) outputs. When the true input has a higher voltage than the complement input, the true output is driven to a higher voltage than the complement output for any delay stage.

The true output from delay stage 14A is connected to the true input of delay stage 14B, while the complement output from delay stage 14A is connected to the complement input of delay stage 14B. Likewise true outputs of delays stages 14B, 14C are connected to true inputs of delay stages 14C, 14D, while the complement outputs are connected to complement inputs for these stages. However, the true and complement outputs of last delay stage 14D are crossed over, so that the true output from last delay stage 14D drives the complement input of first delay stage 14A, while the complement output of delay stage 14D drives the true input of delay stage 14A.

This cross-over of the final stage's outputs effectively produces a loop of twice as many total delay stages as a signal passes around the loop twice. A rising-edge pulse from first delay stage 14A passes along signals DEL1, DEL2, DEL3, DEL4, then loops back and crosses over to DEL1B, DEL2B, DEL3B, and finally DEL1B.

Differential toggle flip-flops 20–27 are connected to the true and complement outputs of delay stages 14A–14D. The differential clock inputs CK+ and CK− of a differential toggle flip-flop are connected to the true and complement outputs of a delay stage. Toggle flip-flops have their Q-BAR output connected back to their D input, so that they change (toggle) state on each rising edge of the clock. Since the flip-flops are fully differential, the Q+ output is fed back to the D− input, and the Q− output is fed back to the D+ input of each differential toggle flip-flop 20–27.

Each delay stage has a pair of differential toggle flip-flops connected in a complementary fashion. One flip-flop changes state on the rising edge of the true output, while the other flip-flop changes state on the rising edge of the complement output. For example, delay stage 14A has differential toggle flip-flop 20 that changes on the rising edge of CK+, and has input CK+ connected to true output DEL1, and input CK− connected to complement output DEL1B. Delay stage 14A also has a second differential toggle flip-flop 24 that changes on the rising edge of CK−, which is also the falling edge of CK+, and has input CK− connected to true output DEL1, and input CK+ connected to complement output DEL1B.

The input frequency of delay stages 14A–14D is divided by two by differential toggle flip-flops 20–27. Since each of the pair of toggle flip-flops on a delay stage change with different clock edges (one rising edge, one falling edge), the outputs of the two differential toggle flip-flops for a delay stage are delayed in phase from each other by half a clock period.

The outputs of differential toggle flip-flops 20–27 are coupled to differential-to-single-ended buffers 30. These buffers 30 can be simple op amps, comparators, or other buffers with a pair of differential inputs and a single output. When the + input of a buffer 30 is higher in voltage than its – input, the output of buffer 30 is high; otherwise the output is low.

A pair of buffers 30 produce a true and a complement output for each differential toggle flip-flop 20–27. Each of the 16 buffers 30 produces a different one of the 16 phases of the output clock φ1–φ16.

Figure 3A:
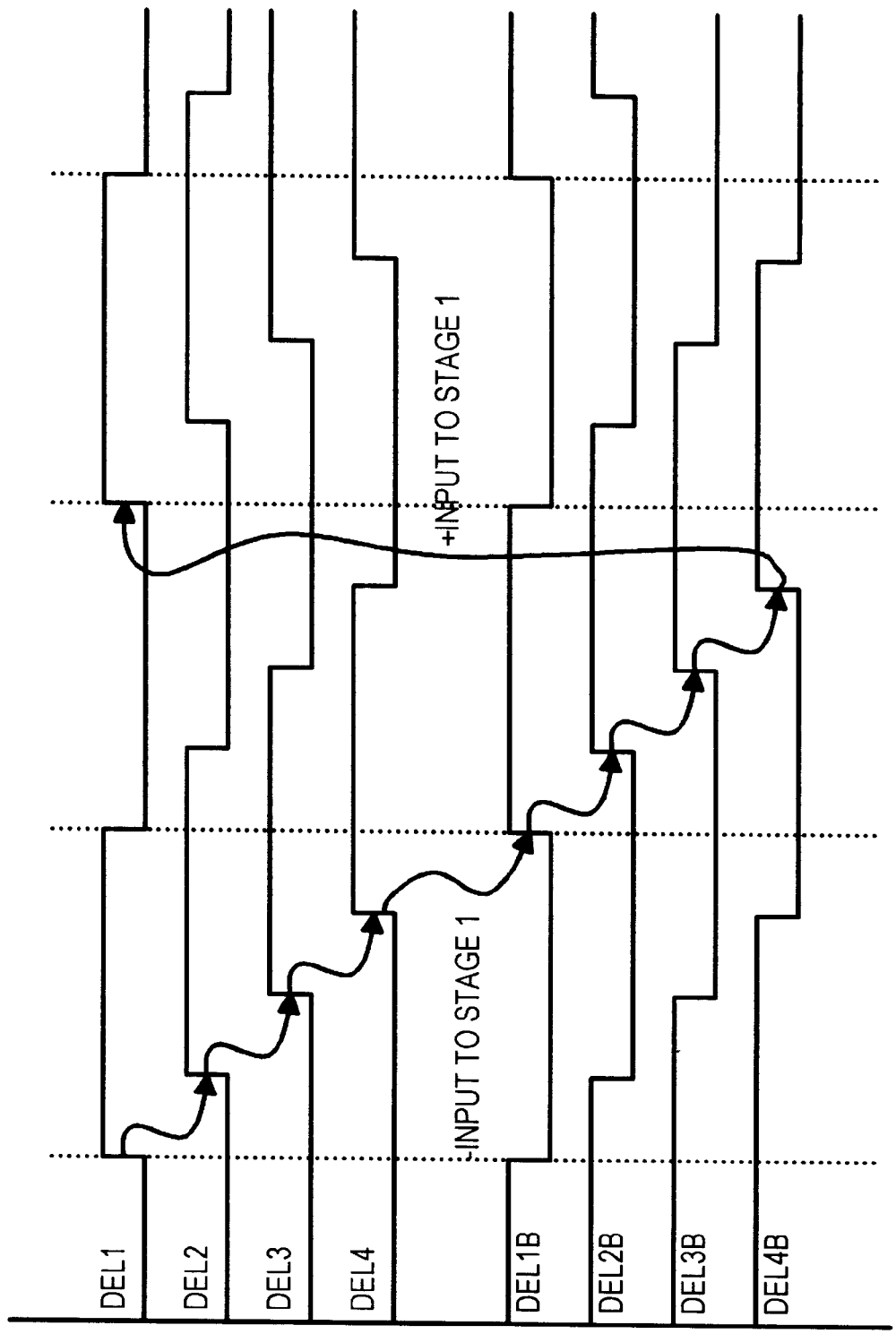
FIGS. 3A–3C are waveforms highlighting operation of the clock generator of FIG.
Figure 3B:
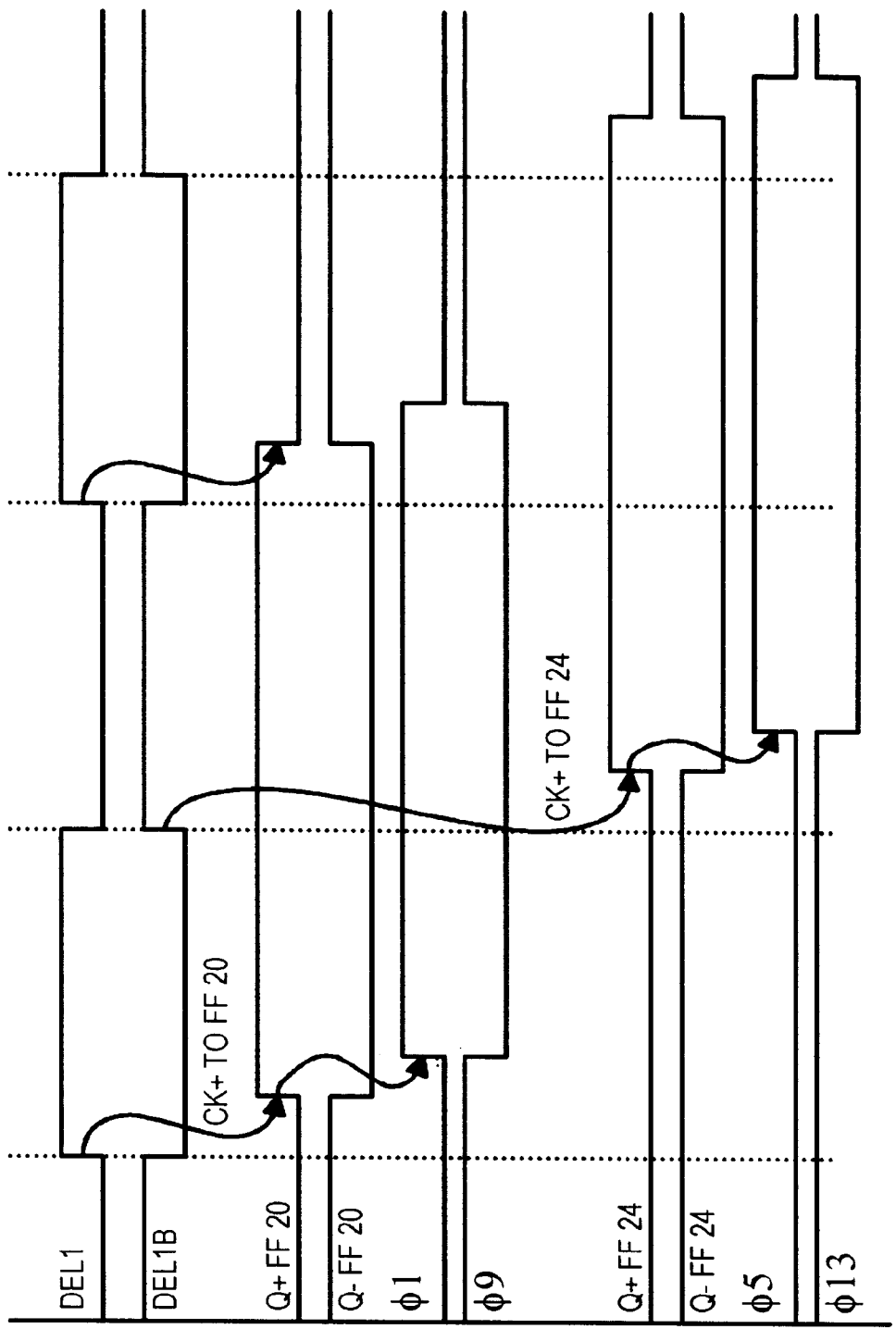
Figure 3C:
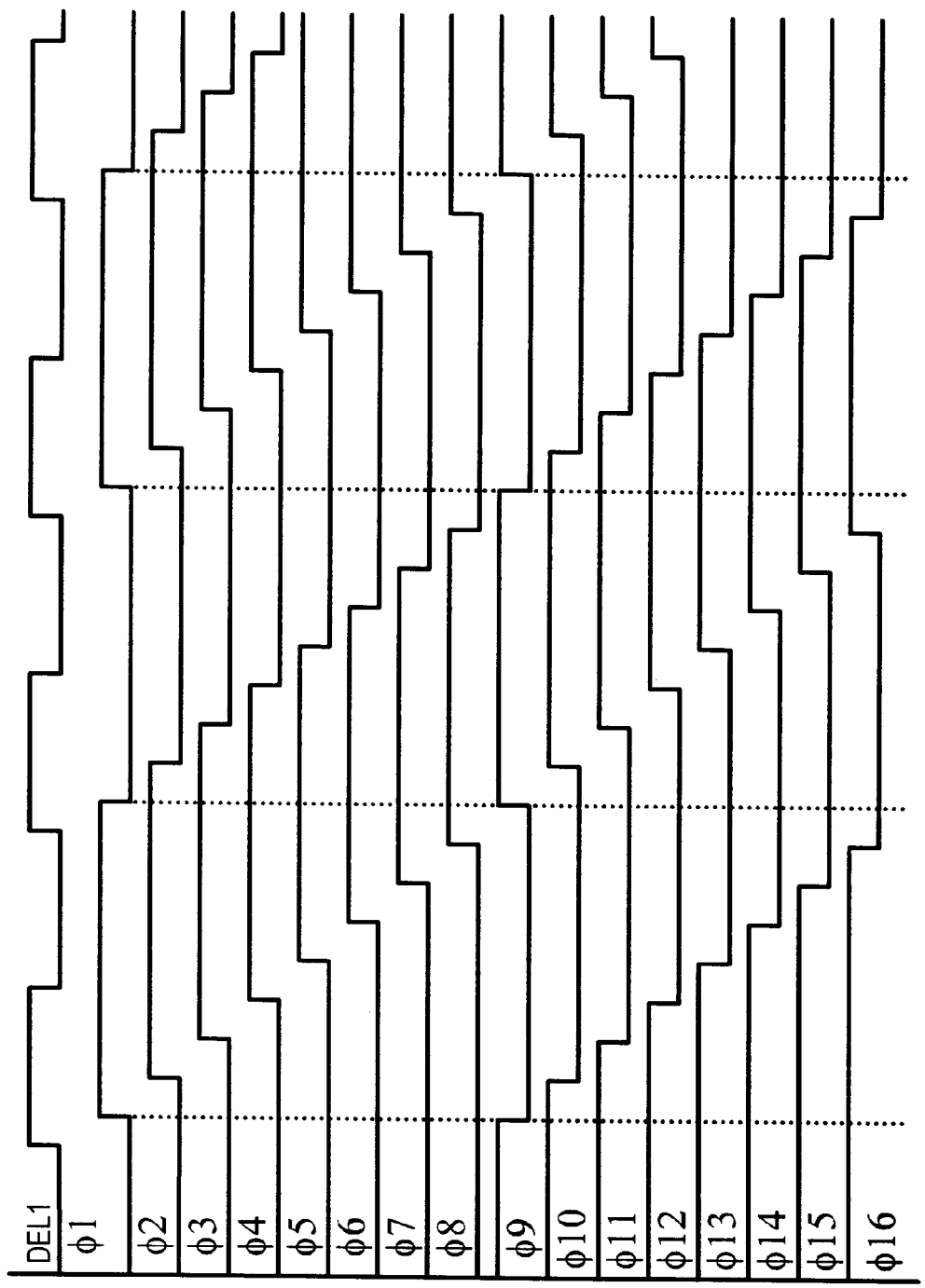

FIGS. 3A–3C are waveforms highlighting operation of the clock generator of FIG. 2. FIG. 3A shows the outputs of the four delay stages 14A–14D. A rising clock edge propagates around the loop, first appearing on the true output (DEL1) of first delay stage 14A, then the true output (DEL2) of second delay stage 14B, then DEL3 of the third stage 14C, and the DEL4 output of last delay stage 14D.

The true output DEL4 of last delay stage 14D is then crossed over and fed back to the complement input of first delay stage 14A, which outputs a rising edge of its complement output DEL1B. This rising clock edge on the complement outputs then propagates around the loop, next appearing on the complement output (DEL2B) of second delay stage 14B, then DEL3B of the third stage 14C, and the DEL4B output of last delay stage 14D. The complement output DEL4B of the last delay stage 14D then crosses over and is fed back to the true input of first delay stage 14A, which again drives its true output DEL1 with a rising edge. The rising edge signal continues to propagate around the loop, producing oscillating outputs at a frequency corresponding to the total loop delay, or 8 stages of delay.

Of course, since the delay buffers are differential, when the true output is driven high, the complement output of the same delay stage is driven low. This can be seen in the waveform diagram since DEL1B goes low as DEL1 is driven high, and likewise DEL2B is driven low as DEL2 is driven high.

FIG. 3B highlights generation of four clock phases from the output of one delay stage. The true output DEL1 of first delay stage 14A and the complement output DEL1B change in opposite directions since they are both driven by the same differential delay stage 14A. Differential toggle flip-flop 20 has its CK+ input connected to DEL1, and its CK– input connected to DEL1B. Since the differential toggle flip-flop changes on the rising edge of its positive clock input (CK+), the outputs of differential toggle flip-flop 20 change state in response to the rising edge of CK+ (DEL1) and falling edge of CK– (DEL1B). Since differential toggle flip-flop 20 is fully differential, its outputs Q+, Q– have identical delays from the clock input (DEL1, DEL1B).

The differential outputs Q+, Q– of differential toggle flip-flop 20 drive a pair of buffers 30, which convert the differential outputs to standard single-ended logic signals. One buffer 30 has its + input driven by Q+, while its – input driven by Q–, and it produces clock φ1. The other buffer 30 has its – input driven by Q+, while its + input driven by Q–, and it produces the inverse of clock φ1, which is φ9. The φ1 and φ9 differential-input-to-rising-edge-output delays are identical regardless of the input polarity connection, since the delays are defined by crossing points and not levels. No systematic error exists, only random mismatch. Therefore, the output rising edges of buffers 30 preserve the ideal timing relationships at their differential inputs.

The other differential toggle flip-flop 24 has its CK+ input connected to DEL1B, and its CK– input connected to DEL1. Since the differential toggle flip-flop changes on the rising edge of its positive clock input (CK+) when both inputs CK+, CK– switch, the outputs of differential toggle flip-flop 20 change state in response to the crossover of the rising edge of CK+ (DEL1B) and falling edge of CK– (DEL1). This is the other clock edge of DEL1, DEL1B.

The differential outputs Q+, Q– of differential toggle flip-flop 24 also drive another pair of buffers 30, which convert the differential outputs to standard single-ended logic signals. One buffer 30 has its + input driven by Q+, while its – input driven by Q–, and it produces clock φ5. The other buffer 30 has its – input driven by Q+, while its + input driven by Q–, and it produces the inverse of clock φ5, which is φ13.

Although there are finite delays through delay stages 14A–14D, differential toggle flip-flops 20–27, and buffers 30, these delays match with no systematic error, only random mismatch, since differential signals are used. True differential gate delays are defined as input crossing point to output crossing point. This delay is the same no matter what the polarity of the input or output connections. In the case of a differential-to-single-ended converter, every differential input to a same polarity output has the same delay. All of the phase outputs in this type embodiment are the same polarity. Therefore their outputs are perfectly timed. This design has no systematic errors. The only errors are random gate mismatch, such as from random process variations. All gate delays are matched. The delays match because the gate delay paths in the differential logic are identical and the polarity of the input and output connection has no effect on the differential gate delay. Thus very precise generation of the multiple clock phases are possible.

FIG. 3C shows the 16 output clocks φ1–φ16 that are generated from the four differential delay stages 14A–14D, differential toggle flip-flops 20–27, and buffers 30. Since the toggle flip-flops divide the frequency of delay signals DEL1–4 by two, the frequency of these output clocks φ1–φ16 are half the frequency of signal DEL1. The phases of clocks φ1–φ16 are equally spaced by one-sixteenth of the output clock period over two periods of the input clock DEL1. Although there is a delay from DEL1 to the output clocks φ1–φ16, the delays among the output clocks are closely matched. Very precise multi-phase clocks result.

Figure 4:
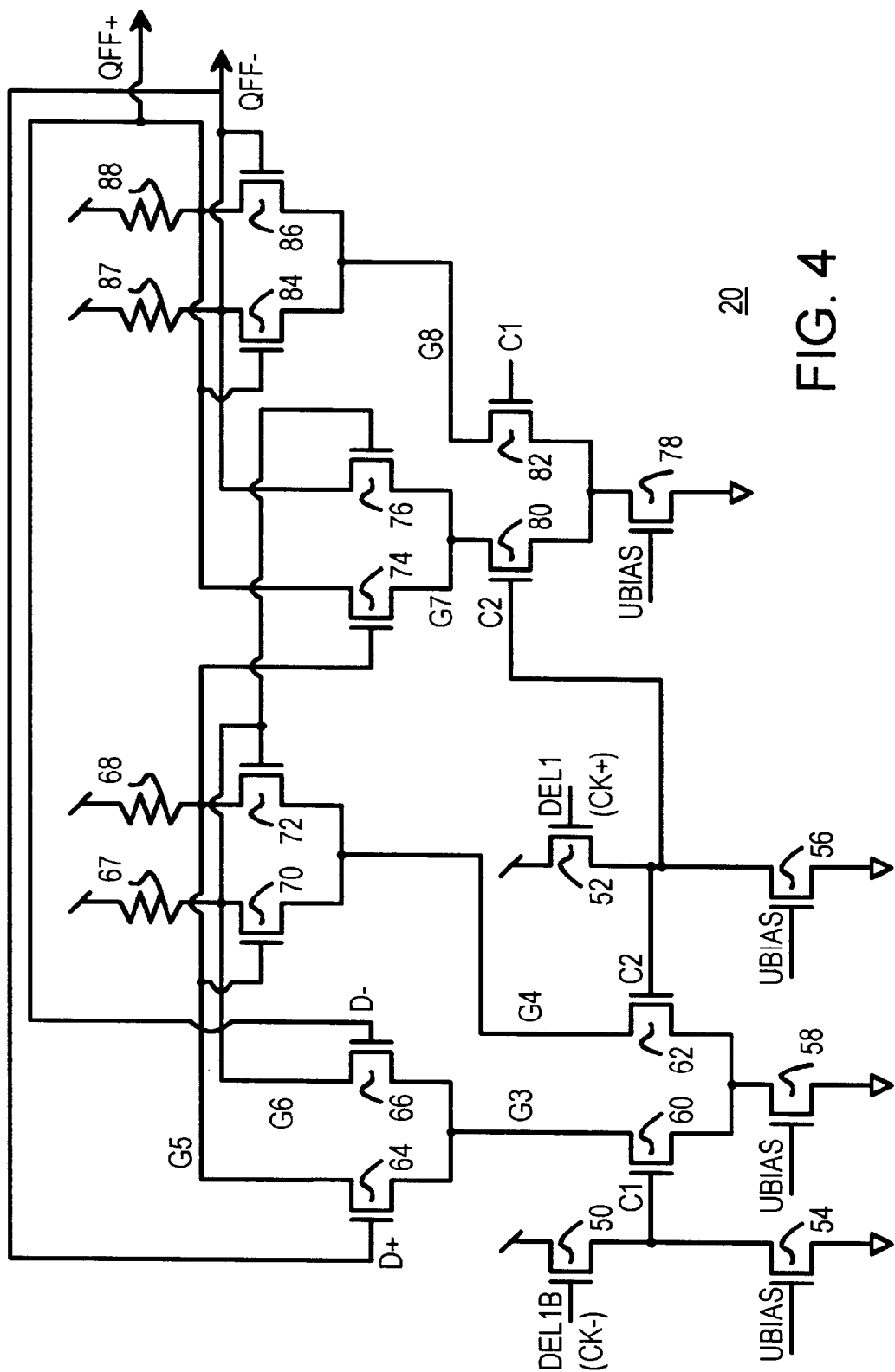
FIG. 4 is a schematic of a differential toggle flip-flop.

FIG. 4 is a schematic of a differential toggle flip-flop. Differential toggle flip-flop 20 receives a clock (CK+) and clock-bar (CK–) input from the true and complement outputs from a delay stage, such as DEL1, DEL1B from first delay stage 14A. Differential toggle flip-flop 24 reverses the connection of DEL1 and DEL1B to CK–, CK+. Other flip-flops 21–23, 25–27 take inputs from DEL1–DEL4 and DEL2B–DEL4B.

The Q+ (QFF+) and Q– (QFF–) outputs from the slave portion of the flip-flop are crossed over and fed back to the data inputs D–, D+, which are the gates of n-channel transistors 64, 66 in the master portion of the flip-flop. This causes the differential flip-flop to operate as a toggle or divide-by-two flip-flop. Each rising edge of the CK+ clock causes the output to toggle state.

The clock inputs CK+, CK– are applied to the gates of n-channel source-follower transistors 52, 50. Tail n-channel transistors 56, 54 sink current from source-follower transistors 52, 50, respectively. As the voltages of CK+, CK– are modulated, the voltages of clock nodes C1, C2 are also modulated.

The master portion sinks a current through tail transistor 58. Current is steered from node G3 to node G4 as CK+ rises and CK− falls. This causes the data applied to the gates of n-channel transistors 64, 66 to be transferred and stored on nodes G5, G6 by virtue of the feedback of nodes G5, G6 to the gates of master storage transistors 70, 72. Resistors 67, 68 supply current to master storage nodes G6, G5.

The slave portion sinks a current through tail transistor 78. Clock nodes C1, C2 are applied to the gates of clock transistors 82, 80, respectively. Current is steered from node G8 to node G7 as CK− rises and CK+ falls. This causes the data applied to the gates of n-channel transistors 74, 76 to be transferred and stored on nodes QFF+, QFF− by virtue of the feedback of nodes QFF+, QFF− to the gates of slave storage transistors 86, 84. Resistors 88, 87 supply current to master storage nodes QFF+, QFF−. Thus the slave portion latches data on CK+ falling, while the master latches data on CK+ rising.

A bias voltage UBIAS is applied to the gates of n-channel tail transistors 54, 56, 58, 78. This bias voltage can be generated by a voltage divider or other bias generator, and sets up the currents in the source followers, master, and slave.

The delays from CK+ or CK− to Q+, Q− are matched, since differential signals and matched devices are used throughout the circuit. When CK+, CK− switch simultaneously, the outputs Q+, Q− also switch together after some delay from the clock inputs. This allows for very precise multi-phase clock signals to be generated.

Figure 5:
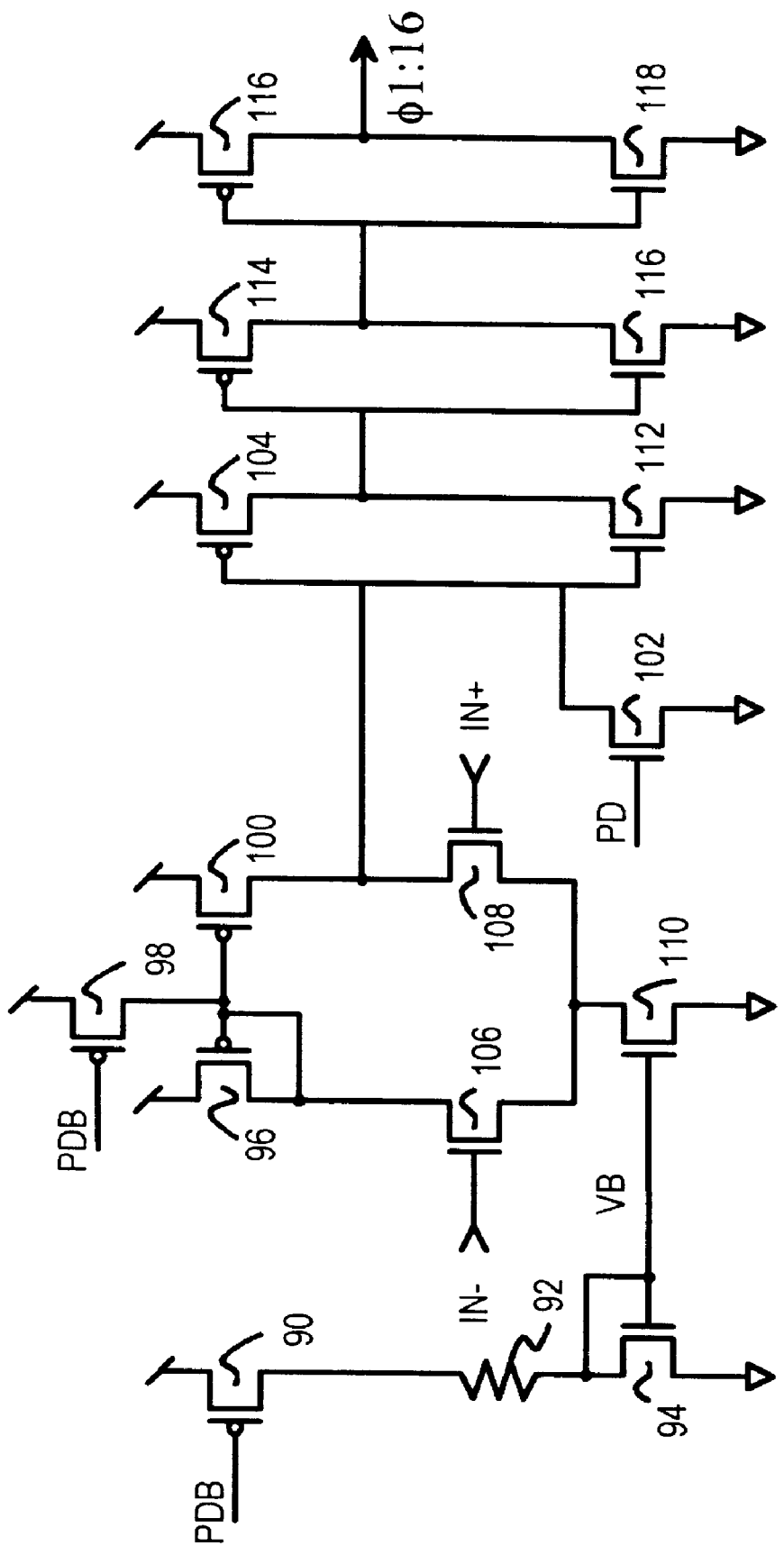
FIG. 5 is a schematic of a differential-to-single-ended buffer.

FIG. 5 is a schematic of a differential-to-single-ended buffer. Buffer 30 Receives the Q+ and Q− outputs from a differential toggle flip-flop. Depending on which clock φ1 to φ16 is to be generated by the buffer 30, the Q+ and Q− outputs from the flip-flop can be applied to either IN+, IN−, respectively, for non-inverting buffering, or to IN−, IN+, respectively, for inversion.

A bias voltage VB is generated by a current flowing through p-channel bias transistor 90, resistor 92, and n-channel bias transistor 94, which has its gate and drain connected together to generate VB. Bias voltage VB is applied to the gate of n-channel tail transistor 110, which sinks a current from the differential sense amplifier.

Differential inputs IN+, IN− are applied to the gates of n-channel differential transistors 108, 106, respectively. Current-mirror transistors 96, 100 are p-channel transistors with their gates connected together and to the drain of transistors 96, 106. The single-ended output is taken from the drains of transistors 100, 108.

The output from the differential amplifier is then buffered by three inverters. Transistors 104, 112 form the first inverter, transistors 114, 116 the second inverter, and transistors 116, 118 the final inverter that drives one of the 16 single-ended clocks φ1:16.

When IN− goes high and IN+ goes low, current through differential transistor 108 is reduced, causing its drain voltage to rise. After buffering, the final clock output φ1 falls. Thus the buffer is non-inverting.

The buffer can be powered down by driving PD high and PDB low. Then power-down n-channel transistor 102 drives the gates of first inverter transistors 104, 112 low. This forces the output into a constant high state. The low PDB turns on power-down p-channel transistor 98, which drives the gates of current-mirror transistors 96, 100 high, turning off current-mirror transistors 96, 100. The low PDB signal to the gate of p-channel bias transistor 90 turns it off, turning off the bias generator and causing bias VB to fall to ground. Thus tail transistor 110 also shuts off.

Figure 6:
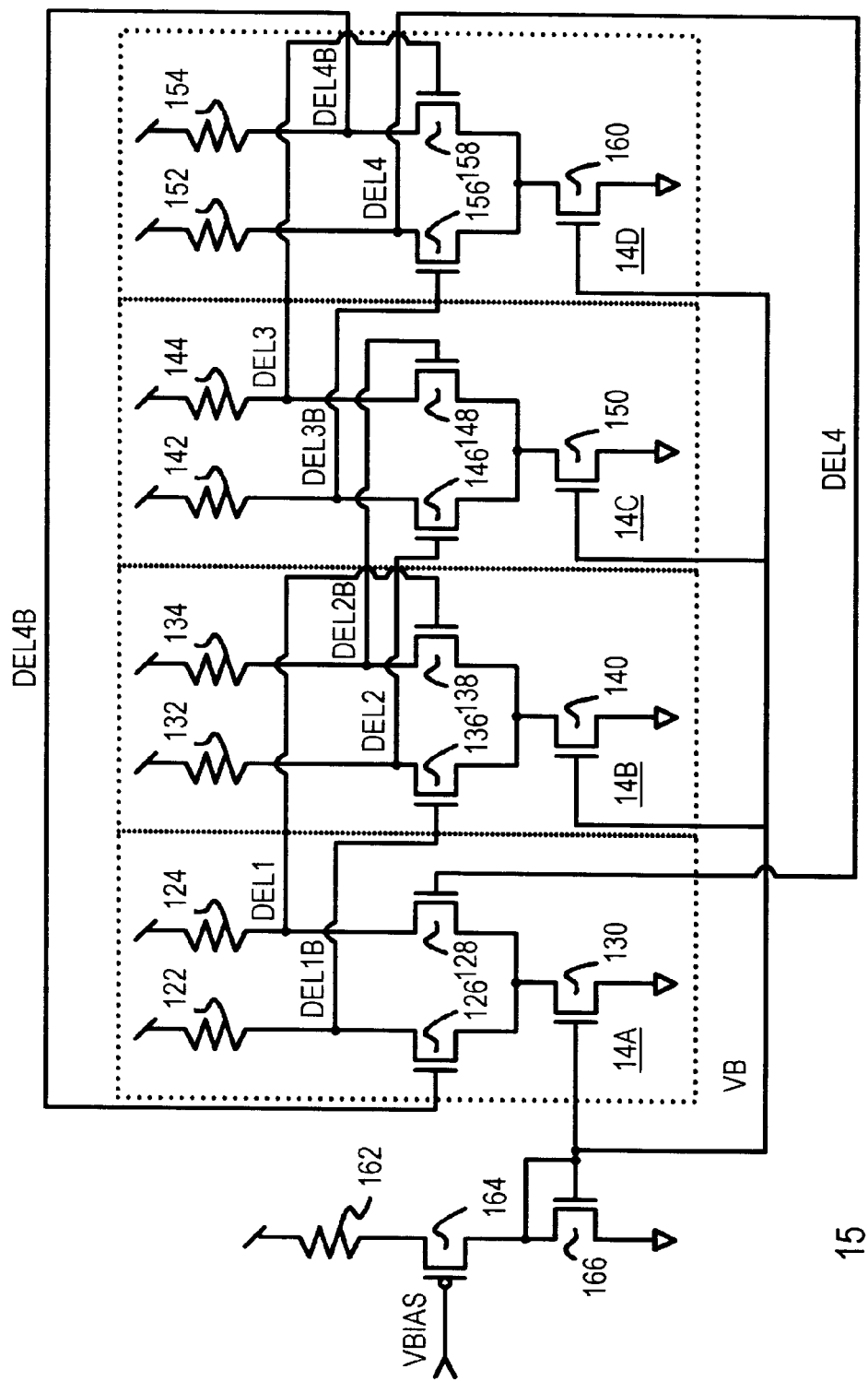
FIG. 6 is a schematic of the delay stages operating in a voltage-controlled oscillator (VCO).

FIG. 6 is a schematic of the delay stages operating in a voltage-controlled oscillator (VCO). Delay stages 14A–14D can operate under voltage-bias control as VCO 15 for a Phase-locked loop (PLL). A voltage input VBIAS is applied to the gate of p-channel bias transistor 164, which modulates the current passing through resistor 162 and n-channel bias transistor 166. As VBIAS rises, current is reduced, causing the gate and drain of n-channel bias transistor 166 to fall in voltage. Since the gate and drain of n-channel bias transistor 166 is a bias voltage VB, VB falls when VBIAS rises.

First delay stage 14A received DEL4B on the gate of n-channel differential transistor 126, and DEL4 on the gate of n-channel differential transistor 128. These signals are crossed-over and fed back from last delay stage 14D. Resistors 122, 124 produce voltages for complement output DEL1B and true output DEL1, respectively.

Second delay stage 14B receives DEL1 on the gate of n-channel differential transistor 138, which modulates current through resistor 134 to generate DEL2B. Second delay stage 14B also receives DEL1B on the gate of n-channel differential transistor 136, which modulates current through resistor 132 to generate DEL2. As DEL1 rises and DEL1B falls, the current through differential transistor 138 rises, lowering the voltage of its drain, DEL2B. The current through differential transistor 136 falls, raising the voltage of its drain, DEL2. Thus delay stage 14B is non-inverting from DEL1 to DEL2, and from DEL1B to DEL2B, but inverting from DEL1 to DEL2B and from DEL1B to DEL2.

Third and fourth delays stages 14C, 14D operate in a similar manner. In third stage 14C, resistor 142 and transistor 146 invert DEL2 to generate DEL3B, while resistor 144 and transistor 148 invert DEL2B to generate DEL3. In last stage 14D resistor 152 and transistor 156 invert DEL3B to generate DEL4, while resistor 154 and transistor 158 invert DEL3 to generate DEL4B.

The outputs DEL1–4 and DEL1B–DEL4B can be used to drive the CK+ and CK− inputs to the differential toggle flip-flops. The delays to any pair of true and complementary outputs, such as to DEL1, DEL1B, are closely matched since differential signals and logic are used. The current-steering logic is very fast and sensitive to small changes in differential input voltages.

Bias voltage VB is applied to the gates of tail transistors 130, 140, 150, 160, which control the tail currents and delays of delay stages 14A–14D. As VBIAS rises, VB falls, tail current fall, and delays increase. Since the total loop delay determines the clock period, VBIAS can be used to adjust the clock period or frequency. The voltage input controls the period of oscillation, so the circuit operates as a VCO. Of course, separate voltage bias generators could be used for some or all delay stages to adjust relative delays.

Figure 7:
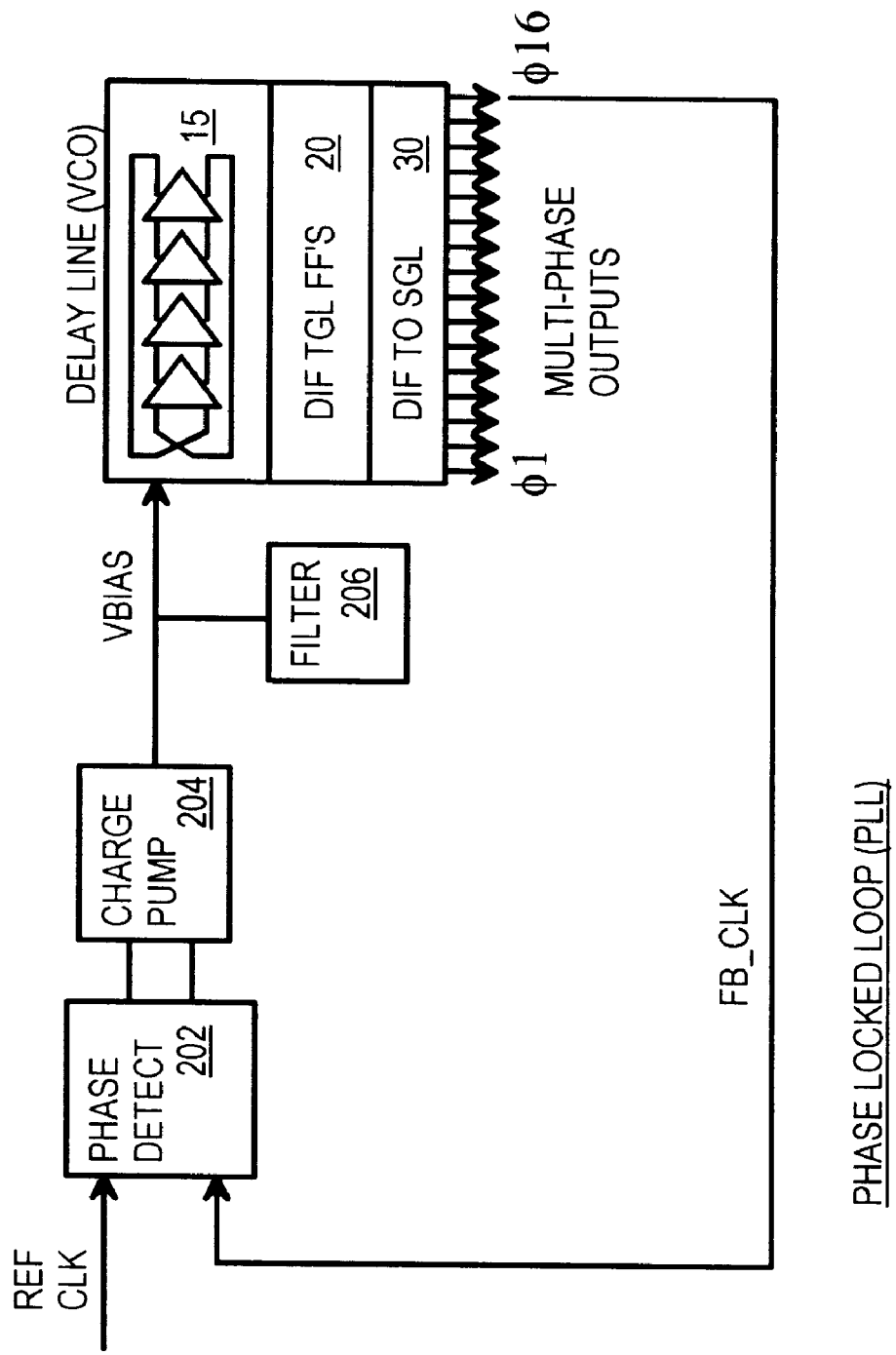
FIG. 7 shows the use of the differential delay stages as a VCO in a PLL.

FIG. 7 shows the use of the differential delay stages as a VCO in a PLL. A reference clock is input to phase detector 202 and compared with a feedback clock. The feedback clock is one of the 16 clock phases φ1–16 from buffers 30. Alternatively, a derivative of one or more of the clock phases φ1–16 can be fed back to phase detector 202, such as by using a clock divider in the feedback path.

Phase detector 202 compares the phase of the reference and feedback clocks, and generates up and down signals to charge pump 204. Phase detector 202 can also compare phases and frequencies, rather than simply phases. The up and down signals cause charge pump 204 to charge or discharge a capacitance in filter 206. This charging or discharging adjusts the control voltage VBIAS.

The control voltage VBIAS is input to VCO 15. VBIAS adjusts the tail currents in the delay stages 14A–14D in VCO 15. Changes in control voltage VBIAS adjust the delays in the delay stages, adjusting the output clock phases. The delay buffers are arranged in a twisted-ring arrangement, with the outputs of the last delay stage cross-coupled to the inputs of the first delay stage. This provides one inversion in the signal path through the delay stages, where each delay stage is encountered twice in the twisted loop.

The true and complement outputs from delay stages 14A–14D drive the differential clock inputs of differential toggle flip-flops 20. The signals output by the delay stages are divided by two by the toggle flip-flops 20. The differential outputs from differential toggle flip-flops 20 are converted to single-ended logic signals by buffers 30 to generate the sixteen clock phases φ1–φ16. Additional clock-selection logic (not shown) can be used to select one of the 16 clock phases for use as a system clock for an external system.

The feedback is taken from one of the 16 clock phases, preferably the final clock phase φ16, although any clock phase can be used. Phase detector 202 and charge pump 204 adjust the VCO control voltage VBIAS to adjust the delays in the delay stages to match the reference clock. The reference clock and multi-phase output clocks φ1–16 operate at half the frequency of VCO 15.

Figure 8:
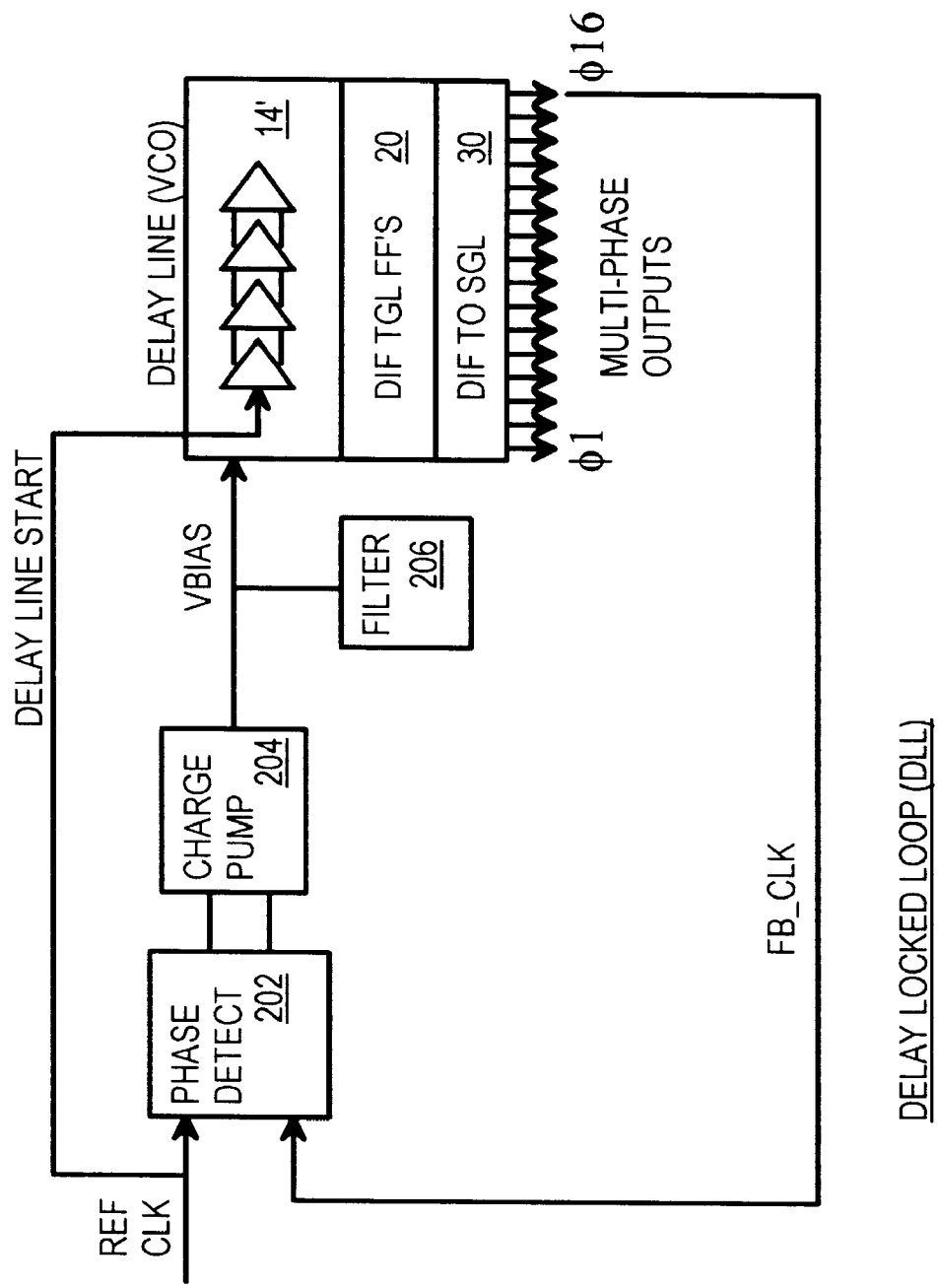
FIG. 8 shows the use of the differential delay stages as an open-ended delay line in a delay-locked loop (DLL).

FIG. 8 shows the use of the differential delay stages as an open-ended delay line in a delay-locked loop (DLL). A DLL is similar to a PLL, but uses a delay line rather than an oscillator. The delay stages 14A–14D are arranged in a single line without the feedback from last delay stage 14D to first stage 14A. Instead, the reference clock (or a derivative) is applied to the input of the first delay stage 14A in delay line 14'. If the reference clock is not differential, a single-ended-to-differential converter (not shown) may be needed to generate true and complement versions of the reference clock to apply to the inputs of the first delay stage.

The reference clock input to phase detector 202 is compared with a feedback clock. The feedback clock is one of the 16 clock phases φ1–16 from buffers 30, or can be taken from the output of the last delay stage. A clock derivative can also be used.

Phase detector 202 generates up and down signals to charge pump 204, which charges or discharges a capacitance in filter 206. This charging or discharging adjusts the control voltage VBIAS.

The control voltage VBIAS is input to delay line 14'. VBIAS adjusts the tail currents in the delay stages 14A–14D in delay line 14'. Changes in control voltage VBIAS adjust the delays in the delay stages, adjusting the output clock period.

The true and complement outputs from delay stages 14A–14D drive the differential clock inputs of differential toggle flip-flops 20. The signals output by the delay stages are divided by two by the toggle flip-flops 20. The differential outputs from differential toggle flip-flops 20 are converted to single-ended logic signals by buffers 30 to generate the sixteen clock phases φ1–φ16. Additional clock-selection logic (not shown) can be used to select one of the 16 clock phases for use as a system clock for an external system. The reference clock and multi-phase output clocks φ1–16 operate at half the frequency of delay line 14' in this particular embodiment.

Figure 9:
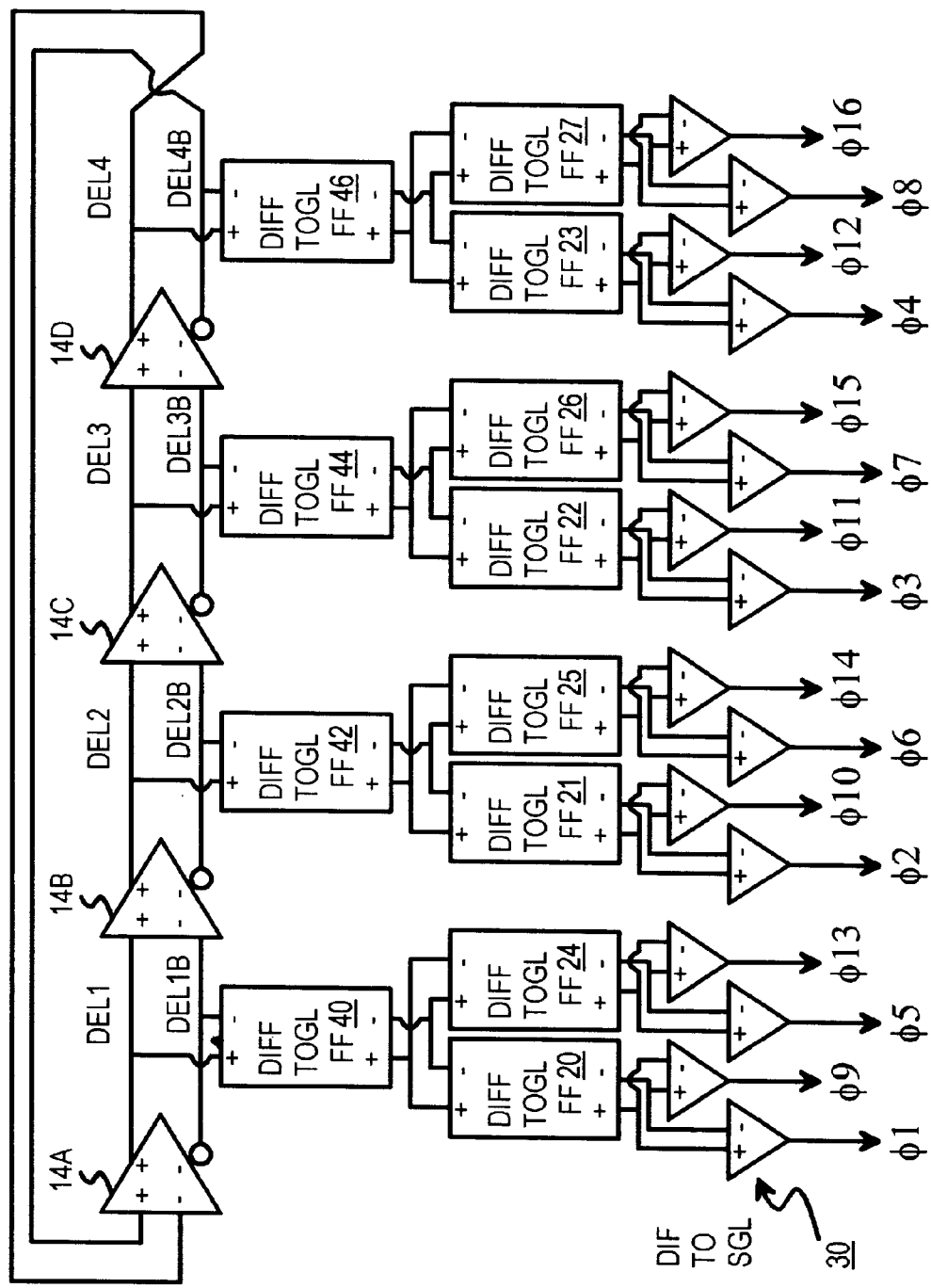
FIG. 9 is an alternative embodiment of the twisted-ring oscillator using differential toggle flip-flops.

FIG. 9 is an alternative embodiment of the twisted-ring oscillator using differential toggle flip-flops. Delay stages 14A–14B are run at twice the frequency of the previous examples, or four times the reference clock frequency. The true and complement outputs DEL1–4, DEL1B–DEL4B are applied to the differential clock inputs CK+, CK– of first-level differential toggle flip-flops 40, 42, 44, 46. First-level differential toggle flip-flops 40, 42, 44, 46 generate true and complement output signals at half the frequency of delay stages 14A–14D. This additional dividing-down of the clocks allows for higher-speed delay stages to be used to generate a slower output clock than may be needed for some applications or processes.

Each pair of true and complement outputs from first-level differential toggle flip-flops 40, 42, 44, 46 drive a pair of differential toggle flip-flops 20–27. The two differential toggle flip-flops 20, 24 in a pair have opposite polarity of input connections so that one toggles on the rising edge and the other toggles on the falling edge of the divided-down clocks output by first-level differential toggle flip-flop 40.

Differential-to-single-ended buffers 30 convert the true and complement outputs from differential toggle flip-flops 20–27 to single-ended clock signals φ1–16. In this example sixteen equally-spaced phases are generated with a frequency being one-quarter of the frequency of delay stages 14A–14D.

Alternate Embodiments

Several other embodiments are contemplated by the inventor. For example, while complete circuits for the differential buffers, toggle flip-flops, and single-ended converters have been shown in detail for purposes of illustration, many other circuits can be substituted for the circuits shown for the delay stages, toggle flip flops, and single-ended converters. Any Emitter-coupled logic (ECL), Pseudo-ECL, Low-Voltage-Differential-Signaling (LVDS), or other differential gate may be substituted. Bipolar, CMOS, NMOS, GaAs, or Germanium transistors could be used. Other divide-by-two circuits can be substituted for the differential toggle flip-flops, or other divisors can be substituted. Negative or positive voltage feedback in the PLL or DLL loop can be used, depending on the polarity of voltage bias control of the delay-stage currents. Several bias voltage lines can be used to separately adjust tail currents and delays of a subset of the delay stages, or individual delay stages.

The loading on the outputs of the delay stages 14A–14D should be matched as closely as possible to match delays, as should the loading on the outputs of differential toggle flip-flops 20–27. Differential signaling allows for slower, less expensive manufacturing processes to be used. Erratic and multiple oscillation are avoided by using few delay stages, while the differential toggle flip-flops allows for many taps or clock phases to be generated from the few delay stages.

The number of stages can be varied. For example, each stage generates 4 clocks in the examples shown, so five stages would generate 20 clocks, 3 stages would generate 12 clocks, seven stages would generate 35 clocks with clocks being spaced by 1/n of the period, such as 1/20 for 5 stages, 1/12 for 3 stages, or 1/35 for 7 stages. The feedback to the phase comparator could use a programmable clock selector to effectively increase or decrease the number of stages in the control loop that sets the stage delays. Some embodiments could use no divide by two and still create twice the number of clock phases as VCO stages. Rather than use single-ended clocks, the clock generator could generate differential clocks. The final differential-to-single-ended converters could then be eliminated.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37

C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A multi-phase clock generator comprising:
    a plurality of delay stages, each delay stage generating a true delay output and a complement delay output in response to a true input and a complement input;
    a pair of differential toggle flip-flops attached to each delay stage including a first flip-flop receiving the true delay output at a positive-clock input and receiving the complement delay output at a negative-clock input, the first flip-flop changing a state of a true output and a complement output when a rising edge of the true delay output and a falling edge of the complement delay output occurs;
    a second flip-flop receiving the complement delay output at a positive-clock input and receiving the true delay output at a negative-clock input, the second flip-flop changing a state of a true output and a complement output when a rising edge of the complement delay output and a falling edge of the true delay output occurs; and
    a plurality of buffers, each buffer receiving a true output and a complement output from either a first flip-flop or from a second flip-flop in the pair of differential toggle flip-flops for a delay stage, each buffer outputting an output clock generated from the true and complement outputs;
    wherein a plurality of the output clocks are generated by the buffers, the output clocks being delayed by different phases but having a same output period, whereby multiple phases of output clocks are generated using differential flip-flops.

2. The multi-phase clock generator of claim 1 wherein a total number of differential flip-flops is two times a number of the delay stages and wherein a total number of the buffers is four times the number of the delay stages and equal to a number of the output clocks.

3. The multi-phase clock generator of claim 1 wherein a number of the delay stages is less than 8,
    whereby overtones and multiple frequency oscillation are prevented by having fewer than 8 delay stages.

4. The multi-phase clock generator of claim 1 wherein a number of the delay stages is 4;
    wherein the plurality of buffers comprises 16 buffers that generate 16 output clocks with a phase spacing between phase-adjacent output clocks of about $\frac{1}{16}^{th}$ of the output period,
    whereby 16 clock phases are generated using 4 delay stages.

5. The multi-phase clock generator of claim 3 wherein each delay stage is coupled to a pair of differential toggle flip-flops driving buffers that generate four output clocks including a first output clock, a second output clock having a phase delay relative to the first output clock of half of the output period, a third output clock having a phase delay relative to the first output clock of a quarter of the output period, and a fourth output clock having a phase delay relative to the first output clock of three-quarters of the output period,
    whereby four output clocks are generated for each delay stage.

6. The multi-phase clock generator of claim 5 wherein the first and second output clocks are generated by buffers driven by the first flip-flop of the pair of differential toggle flip-flops while the third and fourth clocks are generated by buffers driven by the second flip-flop of the pair of differential toggle flip-flops.

7. The multi-phase clock generator of claim 6 wherein the true delay output of a last delay stage in the plurality of delay stages is coupled to drive a complement input of a first delay stage in the plurality of delay stages, and the complement delay output of the last delay stage in the plurality of delay stages is coupled to drive a true input of the first delay stage in the plurality of delay stages,
    wherein all delays stages in the plurality of delay stages except the first delay stage have a true input driven by the true delay output of a preceding delay stage, and a complement input driven by the complement delay output of the preceding delay stage,
    whereby the plurality of delay stages are arranged in a twisted-ring loop.

8. The multi-phase clock generator of claim 7 further comprising:
    a phase detector receiving a reference clock and a feedback clock that is one of the output clocks or is a derivative of one of the output clocks;
    a filter for generating a control voltage; and
    a charge pump, coupled to the phase detector, for charging the filter to adjust the control voltage in response to phase comparison of the reference clock and feedback clock by the phase detector;
    wherein the control voltage adjusts a delay of each delay stage from the true input and the complement input to the true delay output and the complement delay output;
    wherein the multi-phase clock generator is a voltage-controlled oscillator (VCO) in a Phase-locked loop (PLL).

9. The multi-phase clock generator of claim 8 wherein each delay stage in the plurality of delay stages comprises:
    a first differential transistor having a gate that receives the true input and a drain that drives the complement delay output;
    a second differential transistor having a gate that receives the complement input and a drain that drives the true delay output; and
    a tail transistor that receives a bias voltage for adjusting a current switched through the first and second differential transistors, wherein the bias voltage is generated from the control voltage generated by the filter.

10. The multi-phase clock generator of claim 6 further comprising:
a phase detector receiving a reference clock and a feedback clock that is one of the output clocks or is a derivative of one of the output clocks;
a filter for generating a control voltage; and
a charge pump, coupled to the phase detector, for charging the filter to adjust the control voltage in response to phase comparison of the reference clock and feedback clock by the phase detector;
wherein the control voltage adjusts a delay of each delay stage from the true input and the complement input to the true delay output and the complement delay output;
wherein the reference clock is applied to an input to a first delay stage in the plurality of delay stages;
wherein the multi-phase clock generator is a voltage-controlled delay line in a delay-locked loop (DLL).

11. A clock generator comprising:
a first delay stage generating a first true delay output and a first complement delay output that change to opposite states;
a first positive-edge divider, receiving the first true delay output and the first complement delay output, for generating a differential pair of first positive-edge divided outputs that change state when the first true delay output changes from a low state to a high state;
a first converter receiving the differential pair of first positive-edge divided outputs from the first positive-edge divider, for generating a $\phi1$ clock;
a second converter receiving the differential pair of first positive-edge divided outputs from the first positive-edge divider, for generating an inverse $\phi1$ clock that is an inverse of the $\phi1$ clock;
a first negative-edge divider, receiving the first true delay output and the first complement delay output, for generating a differential pair of first negative-edge divided outputs that change state when the first true delay output changes from the high state to the low state;
a third converter receiving the differential pair of first negative-edge divided outputs from the first negative-edge divider, for generating a $\phi1$ quarter clock having a phase delay relative to the $\phi1$ clock of one-quarter of a clock period of the $\phi1$ clock;
a fourth converter receiving the differential pair of first negative-edge divided outputs from the first negative-edge divider, for generating an inverse $\phi1$ quarter clock that is an inverse of the $\phi1$ quarter clock; and
a second delay stage, coupled to the first delay stage, for generating a second true delay output and a second complement delay output that change to opposite states;
a second positive-edge divider, receiving the second true delay output and the second complement delay output, for generating a differential pair of second positive-edge divided outputs that change state when the second true delay output changes from the low state to the high state;
a fifth converter receiving the differential pair of second positive-edge divided outputs from the second positive-edge divider, for generating a $\phi2$ clock;
a sixth converter receiving the differential pair of second positive-edge divided outputs from the second positive-edge divider, for generating an inverse $\phi2$ clock that is an inverse of the $\phi2$ clock;
a second negative-edge divider, receiving the second true delay output and the second complement delay output, for generating a differential pair of second negative-edge divided outputs that change state when the second true delay output changes from the high state to the low state;
a seventh converter receiving the differential pair of second negative-edge divided outputs from the second negative-edge divider, for generating a $\phi2$ quarter clock having a phase delay relative to the $\phi1$ clock of one-quarter of a clock period of the $\phi2$ clock; and
an eighth converter receiving the differential pair of second negative-edge divided outputs from the second negative-edge divider, for generating an inverse $\phi2$ quarter clock that is an inverse of the $\phi2$ quarter clock;
wherein the $\phi2$ clock has a phase delay relative to the $\phi1$ clock of a stage delay through the first delay stage;
whereby eight clocks having different phases are generated from two delay stages.

12. The clock generator of claim 11 further comprising:
a third delay stage, coupled to the second delay stage, for generating a third true delay output and a third complement delay output that change to opposite states;
a third positive-edge divider, receiving the third true delay output and the third complement delay output, for generating a differential pair of third positive-edge divided outputs that change state when the third true delay output changes from the low state to the high state;
a ninth converter receiving the differential pair of third positive-edge divided outputs from the third positive-edge divider, for generating a $\phi3$ clock;
a tenth converter receiving the differential pair of third positive-edge divided outputs from the third positive-edge divider, for generating an inverse $\phi3$ clock that is an inverse of the $\phi3$ clock;
a third negative-edge divider, receiving the third true delay output and the third complement delay output, for generating a differential pair of third negative-edge divided outputs that change state when the third true delay output changes from the high state to the low state;
an eleventh converter receiving the differential pair of third negative-edge divided outputs from the third negative-edge divider, for generating a $\phi3$ quarter clock having a phase delay relative to the $\phi3$ clock of one-quarter of a clock period of the $\phi3$ clock;
a twelfth converter receiving the differential pair of third negative-edge divided outputs from the third negative-edge divider, for generating an inverse $\phi3$ quarter clock that is an inverse of the $\phi3$ quarter clock;
wherein the $\phi3$ clock has a phase delay relative to the $\phi2$ clock of a stage delay through the second delay stage,
whereby at least three delay stages generate at least 12 clocks having different phases.

13. The clock generator of claim 12 further comprising:
a fourth delay stage, coupled to the third delay stage, for generating a fourth true delay output and a fourth complement delay output that change to opposite states;
a fourth positive-edge divider, receiving the fourth true delay output and the fourth complement delay output, for generating a differential pair of fourth positive-edge divided outputs that change state when the fourth true delay output changes from the low state to the high state;

a thirteenth converter receiving the differential pair of fourth positive-edge divided outputs from the fourth positive-edge divider, for generating a φ4 clock;

a fourteenth converter receiving the differential pair of fourth positive-edge divided outputs from the fourth positive-edge divider, for generating an inverse φ4 clock that is an inverse of the φ4 clock;

a fourth negative-edge divider, receiving the fourth true delay output and the fourth complement delay output, for generating a differential pair of fourth negative-edge divided outputs that change state when the fourth true delay output changes from the high state to the low state;

a fifteenth converter receiving the differential pair of fourth negative-edge divided outputs from the fourth negative-edge divider, for generating a φ4 quarter clock having a phase delay relative to the φ4 clock of one-quarter of a clock period of the φ4 clock;

a sixteenth converter receiving the differential pair of fourth negative-edge divided outputs from the fourth negative-edge divider, for generating an inverse φ4 quarter clock that is an inverse of the φ4 quarter clock;

wherein the φ4 clock has a phase delay relative to the φ3 clock of a stage delay through the third delay stage, whereby at least four delay stages generate at least 16 clocks having different phases.

14. The clock generator of claim 13 wherein the first delay stage, the second delay stage, and the third delay stage have equal delays;

wherein the phase delay from the φ1 clock to the φ2 clock is equal to the phase delay from the φ2 clock to the φ3 clock, which is equal to the phase delay from the φ3 clock to the φ4 clock, whereby equal phase delays are generated.

15. The clock generator of claim 13 wherein the fourth complement delay output from the fourth delay stage is fed back to a first true input to the first delay stage;

wherein the fourth true delay output from the fourth delay stage is fed back to a first complement input to the first delay stage, whereby the first, second, third, and fourth delay stages are arranged in a twisted-ring loop.

16. The clock generator of claim 13 wherein the first delay stage further comprises:

a first delay stage differential buffer that generates a first true loop output and a first complement loop output to the second delay stage, and a first initial divider, receiving the first true loop output and receiving a first complement loop output, for generating the first true delay output and the first complement delay output having half of a frequency of the first true loop output;

wherein the second delay stage further comprises:

a second delay stage differential buffer, receiving the first true loop output and the first complement loop output, for generating a second true loop output and a second complement loop output to the third delay stage, and a second initial divider, receiving the second true loop output and receiving a second complement loop output, for generating the second true delay output and the second complement delay output having half of a frequency of the second true loop output;

wherein the third delay stage further comprises:

a third delay stage differential buffer, receiving the second true loop output and the second complement loop output, for generating a third true loop output and a third complement loop output to the fourth delay stage, and a third initial divider, receiving the third true loop output and receiving a third complement loop output, for generating the third true delay output and the third complement delay output having half of a frequency of the third true loop output;

wherein the fourth delay stage further comprises:

a fourth delay stage differential buffer, receiving the third true loop output and the third complement loop output, for generating a fourth true loop output and a fourth complement loop output; and a fourth initial divider, receiving the fourth true loop output and receiving a fourth complement loop output, for generating the fourth true delay output and the fourth complement delay output having half of a frequency of the fourth true loop output, whereby delay stage signals are initially divided by two.

17. A differential clock synthesizer comprising:

a plurality of no more than 7 stages in a series that includes a first stage and a last stage, each stage comprising:

differential delay means, having a true input and a complement input that are driven in opposite directions, for generating a true delay output and a complement delay output;

positive divider means, receiving the true delay output at a positive-clock input and receiving the complement delay output at a negative-clock input, for switching a positive-edge true divided output and a positive-edge complement divided output in response to a rising edge of the positive-clock input; and negative divider means, receiving the true delay output at a negative-clock input and receiving the complement delay output at a positive-clock input, for switching a negative-edge true divided output and a negative-edge complement divided output in response to a rising edge of the negative-clock input;

wherein the positive-edge true divided output is a first clock and the positive-edge complement divided output is a second clock that is 180 degrees out of phase with the first clock;

wherein the negative-edge true divided output is a third clock that is 90 degrees out of phase with the first clock, and the negative-edge complement divided output is a fourth clock that is 270 degrees out of phase with the first clock;

wherein the first, second, third, and fourth clocks from each stage are delayed from a corresponding clock in a preceding stage by a delay determined by the differential delay means, whereby four multi-phase clocks are generated for each stage.

18. The differential clock synthesizer of claim 17 further comprising:

feedback means, coupled between the last stage and the first stage, for feeding the true delay output from the differential delay means of the last stage to the complement input of the first stage, and for feeding the complement delay output from the differential delay means of the last stage to the true input of the first stage, whereby an inversion is introduced by feedback.

19. The differential clock synthesizer of claim 17 wherein each differential delay means further comprises:

voltage control means, responsive to a control voltage, for adjusting a delay through the differential delay means in response to changes in the control voltage, whereby delays through the differential delay means are adjusted.

20. The differential clock synthesizer of claim 19 further comprising:

phase compare means, receiving a feedback clock generated by the last stage, for comparing to a reference clock to adjust the control voltage, whereby the delays and the control voltage are adjusted based on phase comparison.

* * * * *